(12) United States Patent
Hirai

(10) Patent No.: US 6,172,881 B1
(45) Date of Patent: Jan. 9, 2001

(54) METHOD OF INTERCONNECTING FRAME GROUNDS IN HOUSING, AND ELECTRONIC EQUIPMENT WITH STRUCTURE INTERCONNECTED BY THE METHOD

(75) Inventor: Koji Hirai, Yokohama (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/008,507

(22) Filed: Jan. 16, 1998

(30) Foreign Application Priority Data

Jan. 21, 1997 (JP) .................................................. 9-008462

(51) Int. Cl.[7] ...................................................... H05K 9/00
(52) U.S. Cl. .......................... 361/816; 361/799; 361/800; 361/816; 361/818; 174/35 R
(58) Field of Search .................................. 361/752, 753, 361/789, 794, 799, 800, 803, 816, 818; 174/252, 35 C, 35 R, 51; 439/69, 92

(56) References Cited

U.S. PATENT DOCUMENTS

| | | | | |
|---|---|---|---|---|
| 5,432,486 | * | 7/1995 | Wong ................................... | 333/109 |
| 5,469,336 | * | 11/1995 | Soulard ................................ | 361/818 |
| 5,519,584 | * | 5/1996 | Siraky .................................. | 361/789 |
| 5,523,695 | * | 6/1996 | Lin ....................................... | 324/755 |
| 5,604,668 | * | 2/1997 | Wohrstein et al. ................... | 361/816 |
| 5,680,297 | * | 10/1997 | Price et al. .......................... | 361/818 |
| 5,717,556 | * | 2/1998 | Yanagida ............................. | 361/803 |
| 5,742,484 | * | 4/1998 | Gillete et al. ........................ | 361/789 |
| 5,917,149 | * | 6/1999 | Barcley et al. ..................... | 174/35 C |

* cited by examiner

Primary Examiner—Jeffrey Gaffin
Assistant Examiner—Tuan Dinh
(74) Attorney, Agent, or Firm—Fitzpatrick, Cella, Harper & Scinto

(57) ABSTRACT

Electronic equipment includes a plurality of circuit boards in a housing, and a plurality of plate metals in the housing, with each of the plate metals being connected to one of the circuit boards as frame grounds. A cable interconnects the plurality of circuit boards, and a conductive member interconnects the plurality of plate members. The conductive member suppresses production of radiation noise from the cable by reducing a common mode electrical current flowing in the cable.

14 Claims, 6 Drawing Sheets

METHOD OF INTERCONNECTING FRAME GROUNDS IN HOUSING, AND ELECTRONIC EQUIPMENT WITH STRUCTURE INTERCONNECTED BY THE METHOD

BACKGROUND OF THE INVENTION

1. Field of the Invention

The present invention relates to a method of interconnecting the frame grounds in a housing so as to suppress radiation noise from the cable between circuit boards, and an electronic equipment with a structure connected by the method.

2. Related Background Art

Conventionally, the frame grounds in a housing are interconnected, as shown in FIG. 9. More specifically, in a housing including circuit boards $2_1$ and $2_2$, the housing or plate metals $1_1$ and $1_2$ connected to the housing are connected as frame grounds FG to the board grounds via members $5_1$ and $5_2$ as means for reinforcing the board grounds so as to take a measure against radiation noise from the circuit boards $2_1$ and $2_2$. The circuit boards $2_1$ and $2_2$ are connected to each other by a cable 4 via connectors $3_1$ and $3_2$, and the cable 4 uses a shield cable as a measure against its radiation noise.

However, in the prior art, when the circuit boards $2_1$ and $2_2$ are connected by the cable 4, different plate metals $1_1$ and $1_2$ are often connected to the circuit boards $2_1$ and $2_2$ in consideration of the layout in the housing. FIG. 10 illustrates the state between such different plate metals $1_1$ and $1_2$, i.e., different frame grounds. When the circuit boards $2_1$ and $2_2$ are connected to different frame grounds FG1 and FG2, these frame grounds FG1 and FG2 normally have different ground potentials Vg1 and Vg2, and a potential difference Vgc between these ground potentials is called a common mode potential. When the circuit boards $2_1$ and $2_2$ connected to the frame grounds FG1 and FG2 with different ground potentials Vg1 and Vg2 are connected by the cable 4, a common mode current Ic owing to the common mode potential concentratively flows through the cable 4, and common mode noise is radiated from the cable 4. Such common mode noise cannot be sufficiently shielded by the shield cable, and it is very difficult to solve this noise problem.

SUMMARY OF THE INVENTION

It is an object of the present invention to solve the above-mentioned problems, and to provide a method of interconnecting the frame grounds in a housing, which can suppress radiation noise produced from the cable between circuit boards by reducing the potential difference between the frame grounds in the housing, and an electronic equipment with a structure interconnected by the method.

It is another object of the present invention to interconnect frame grounds via a conductive member at their neighboring positions.

Other objects of the present invention will become apparent from the following detailed description of the embodiments.

DESCRIPTION OF THE PREFERRED EMBODIMENTS

The preferred embodiments of the present invention will now be described with reference to the accompanying drawings.

First Embodiment

Figure 1:
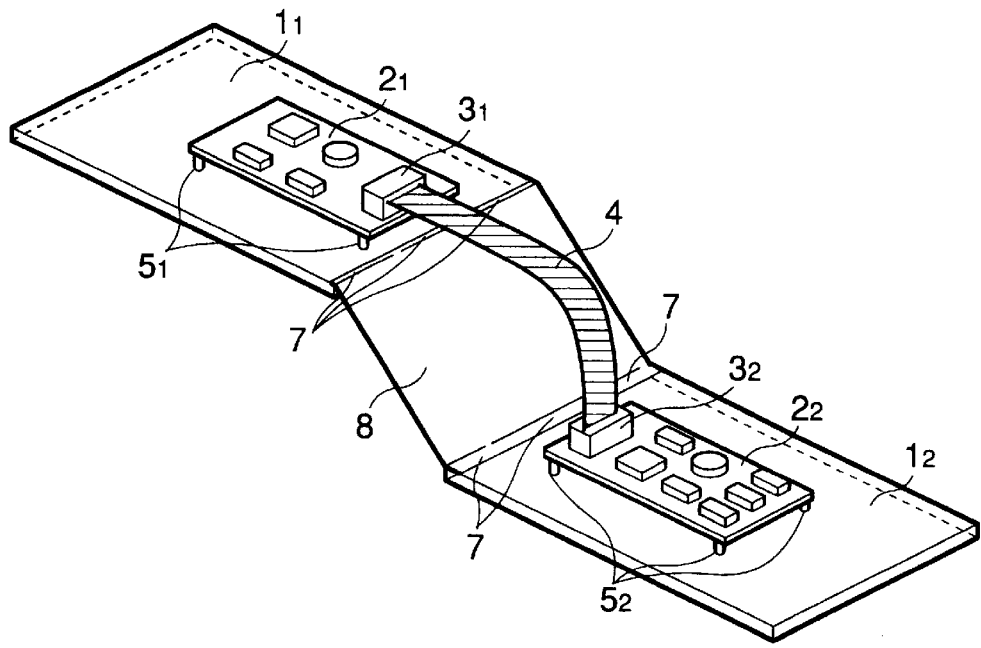
FIG. 1 is a perspective view showing the case wherein the frame grounds in a housing are interconnected via a conductive metal plate according to the first embodiment of the present invention.

FIG. 1 shows interconnection between the frame grounds in a housing according to the first embodiment of the present invention. In FIG. 1, plate metals $1_1$ and $1_2$ serve as frame grounds, and circuit boards $2_1$ and $2_2$ are equipped in the housing. The plate metals $1_1$ and $1_2$ are connected as frame grounds FG to the circuit boards $2_1$ and $2_2$ via members $5_1$ and $5_2$, as means for reinforcing the board grounds so as to take a measure against radiation noise from the circuit boards $2_1$ and $2_2$. The circuit boards $2_1$ and $2_2$ are connected by a cable 4 via connectors $3_1$ and $3_2$, and the cable 4 uses a shield cable as a measure against its radiation noise. Furthermore, different plate metals $1_1$ and $1_2$ are connected to the circuit boards $2_1$ and $2_2$ in consideration of the layout in the housing, and such different plate metals $1_1$ and $1_2$, i.e., frame grounds, are connected by a conductive metal plate 8. The portions connected by this conductive metal plate 8 are neighboring portions between the frame grounds or positions close to the cable 4. More specifically, the portions connected by this conductive metal plate 8 are those near the portions where the circuit boards $2_1$ and $2_2$ are connected to the frame grounds FG1 and FG2, i.e., those near the connection portions between the circuit boards $2_1$ and $2_2$ and the frame grounds FG1 and FG2, which are connected in the vicinity of the connectors $3_1$ and $3_2$ of the cable 4 on the circuit boards $2_1$ and $2_2$.

Figure 2:
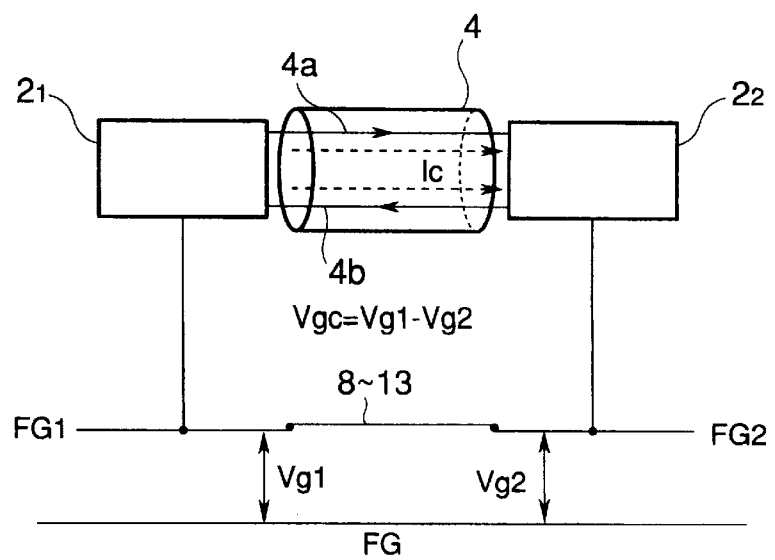
FIG. 2 is a diagram of a structure for suppressing common mode noise radiated from a cable so as to explain the theory of interconnection of the frame grounds in the housing shown in FIG. 1.

FIG. 2 illustrates the connected state between these different plate metals $1_1$ and $1_2$, i.e., frame grounds FG1 and FG2.

Since the frame grounds FG1 and FG2 are interconnected by the conductive metal plate 8, the potential difference between the frame grounds FG1 and FG2, i.e., a common mode potential Vgc can be reduced to decrease a common mode current Ic that flows through the cable 4, thereby suppressing radiation of common mode noise.

Second Embodiment

The second embodiment of the present invention will be described below with reference to FIG. 3. Note that the same reference numerals in FIG. 3 denote the same parts as in FIG. 1 of the first embodiment, and a detailed description thereof will be omitted.

Figure 3:
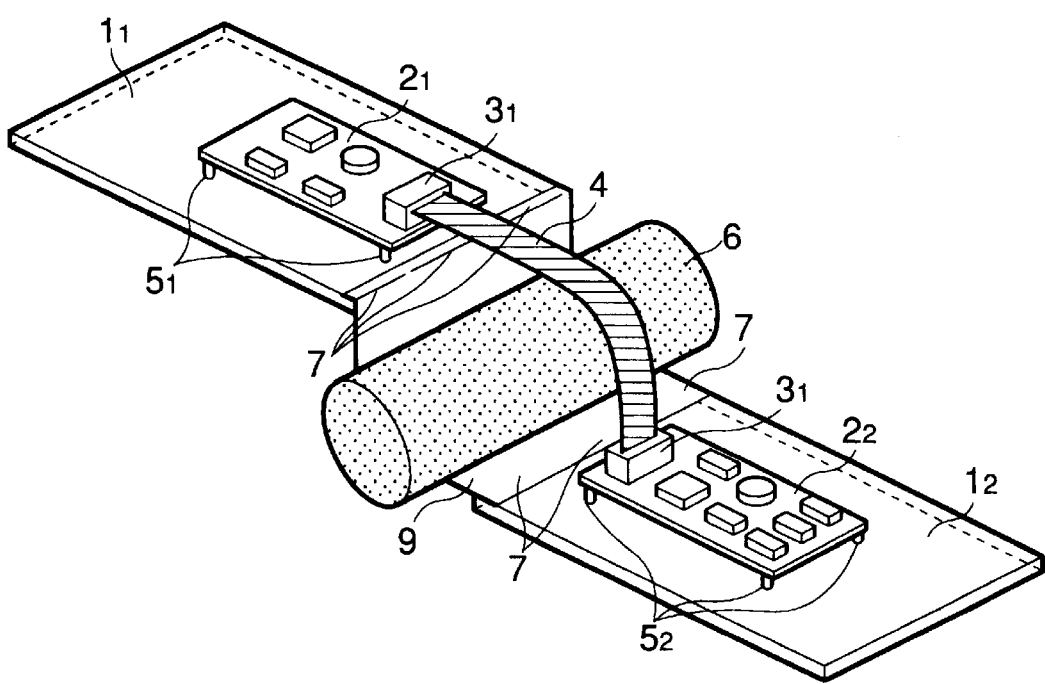
FIG. 3 is a perspective view showing the case wherein the frame grounds in a housing are interconnected via a conductive sheet according to the second embodiment of the present invention.

In FIG. 3, the frame grounds are interconnected by a flexible conductive sheet 9 at portions in the vicinity of the cable 4. Using the flexible conductive sheet 9, even when the frame grounds are hard to interconnect by the conductive metal plate 8 unlike in the first embodiment in the presence of an internal member 6 of the housing, connections can be done.

The shape of the conductive sheet 9 is not limited to a sheet-like shape but may be a flexible mesh-like sheet.

Third Embodiment

The third embodiment of the present invention will be described below with reference to FIGS. 4, 5, and 6. Note that the same reference numerals in FIGS. 4, 5, and 6 denote the same parts as in FIG. 1 of the first embodiment, and a detailed description thereof will be omitted.

Figure 4:
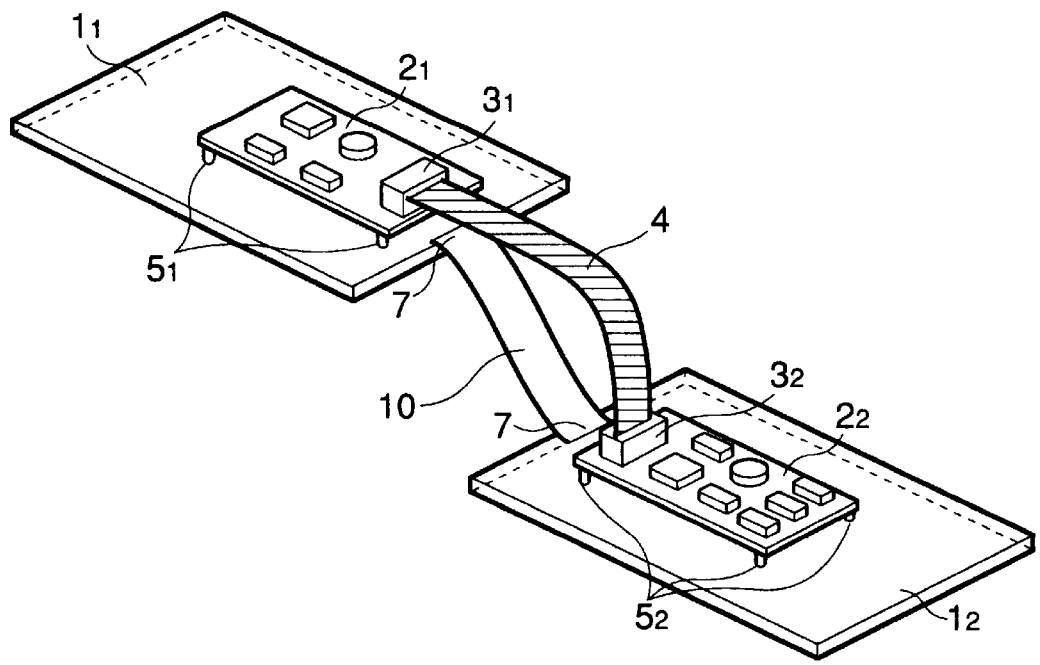
FIG. 4 is a perspective view showing the case wherein the frame grounds in a housing are interconnected via a single band-like conductive metal plate according to the third embodiment of the present invention.
Figure 5:
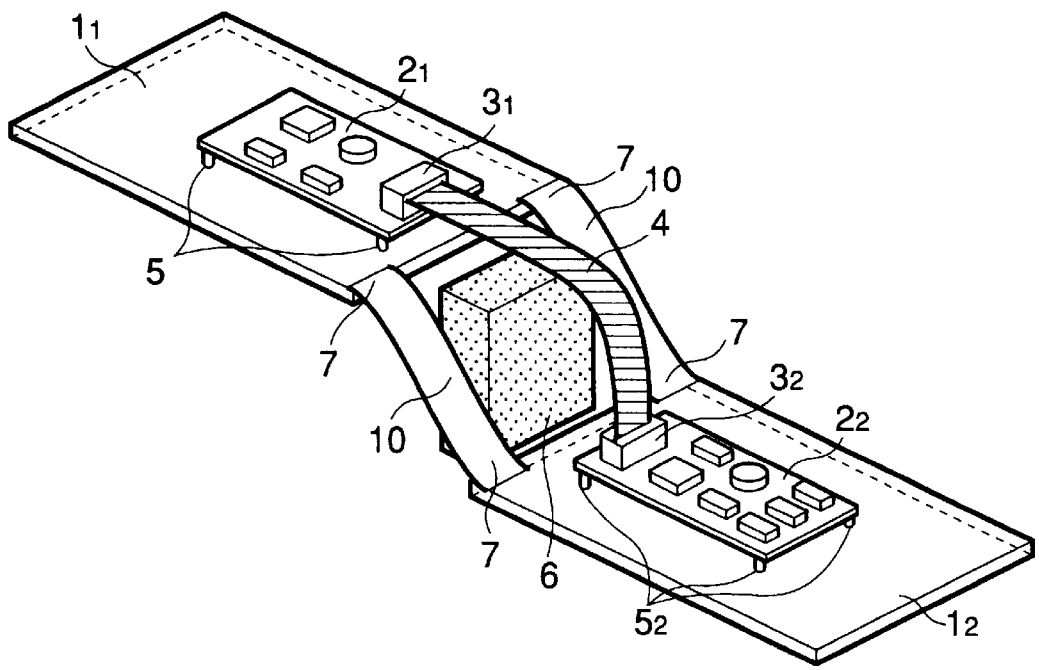
FIG. 5 is a perspective view showing the case wherein the frame grounds in the housing shown in FIG. 4 are interconnected by two band-like conductive metal plates.
Figure 6:
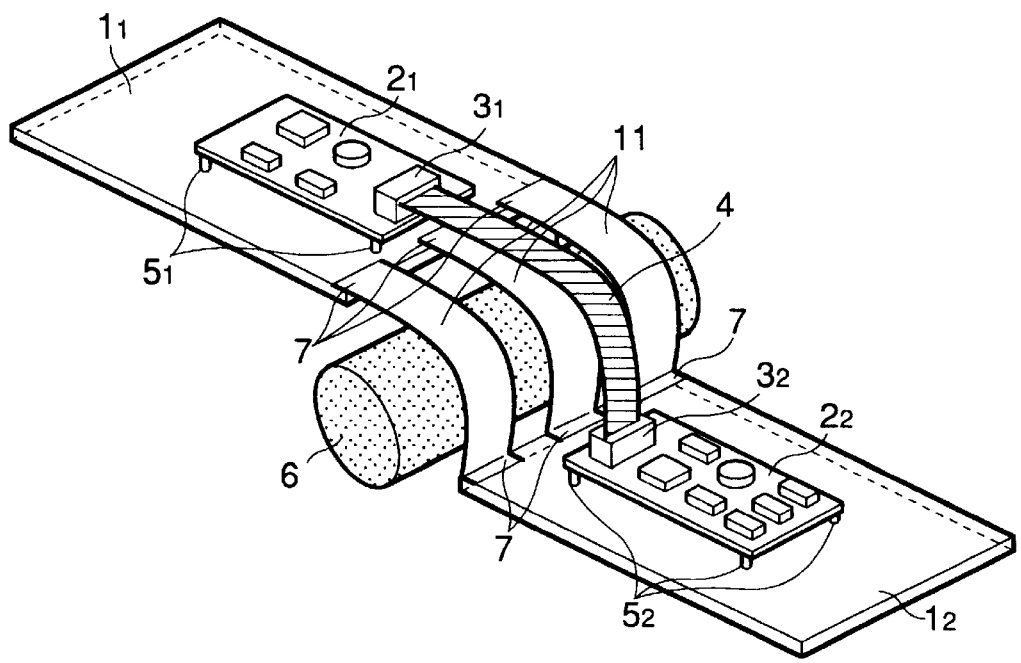
FIG. 6 is a perspective view showing the case wherein the frame grounds in the housing shown in FIG. 4 are interconnected by three band-like conductive metal plates.

In FIGS. 4, 5, and 6, the frame grounds are interconnected by a band-like conductive member or members 10 or 11. That is, FIGS. 4, 5, and 6 show cases wherein the frame grounds are interconnected respectively by a single band-like conductive metal plate 10, two band-like metal plates 10, and three flexible band-like conductive sheets 11.

Even when the sheet-like conductive member 9 cannot be used due to a limited space or specific board layout structure, since one or a plurality of band-like conductive members 10 or flexible band-like conductive members 11 are used, e.g., below the cable, the common mode potential Ic between the frame grounds can be reduced, and radiation of common mode noise from the cable 4 can be suppressed.

Fourth Embodiment

The fourth embodiment of the present invention will be described below with reference to FIG. 7. Note that the same reference numerals in FIG. 7 denote the same parts as in FIG. 1 of the first embodiment, and a detailed description thereof will be omitted.

Figure 7:
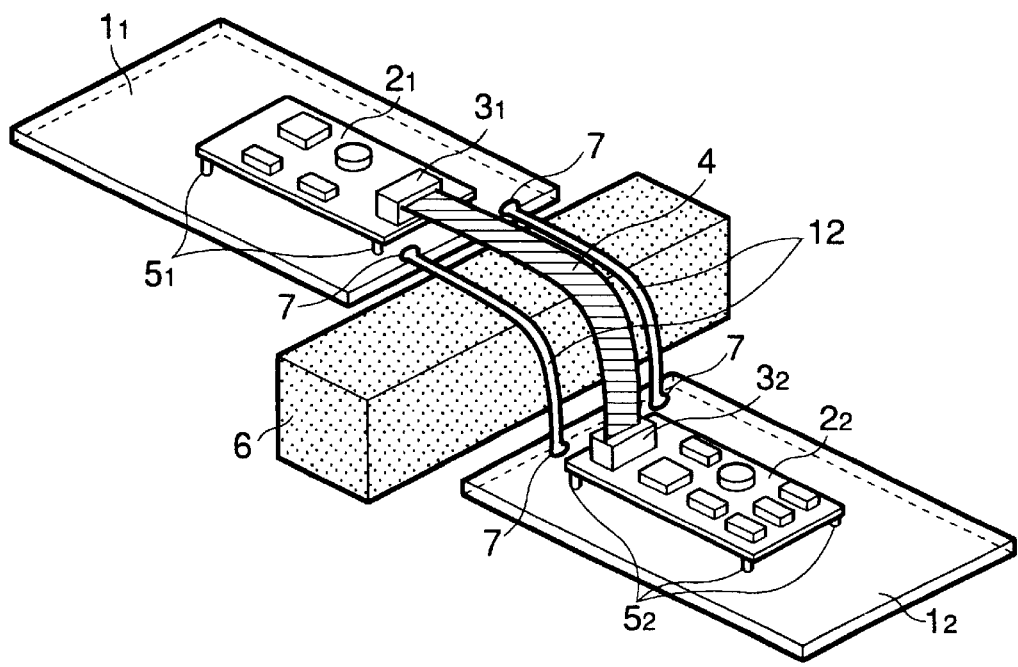
FIG. 7 is a perspective view showing the case wherein the frame grounds in a housing are interconnected via two conductive lines according to the fourth embodiment of the present invention.

In FIG. 7, the frame grounds are interconnected by two conductive lines 7 at two points each in the vicinities of the connected portions between the frame grounds and circuit boards.

The linear conductive members are formed of a conductive metal, conductive metal foil, conductive resin, conductive metal braided wire, conductive fiber, or the like.

Fifth Embodiment

The fifth embodiment of the present invention will be described below with reference to FIG. 8. Note that the same reference numerals in FIG. 8 denote the same parts as in FIG. 1 of the first embodiment, and a detailed description thereof will be omitted.

Figure 8:
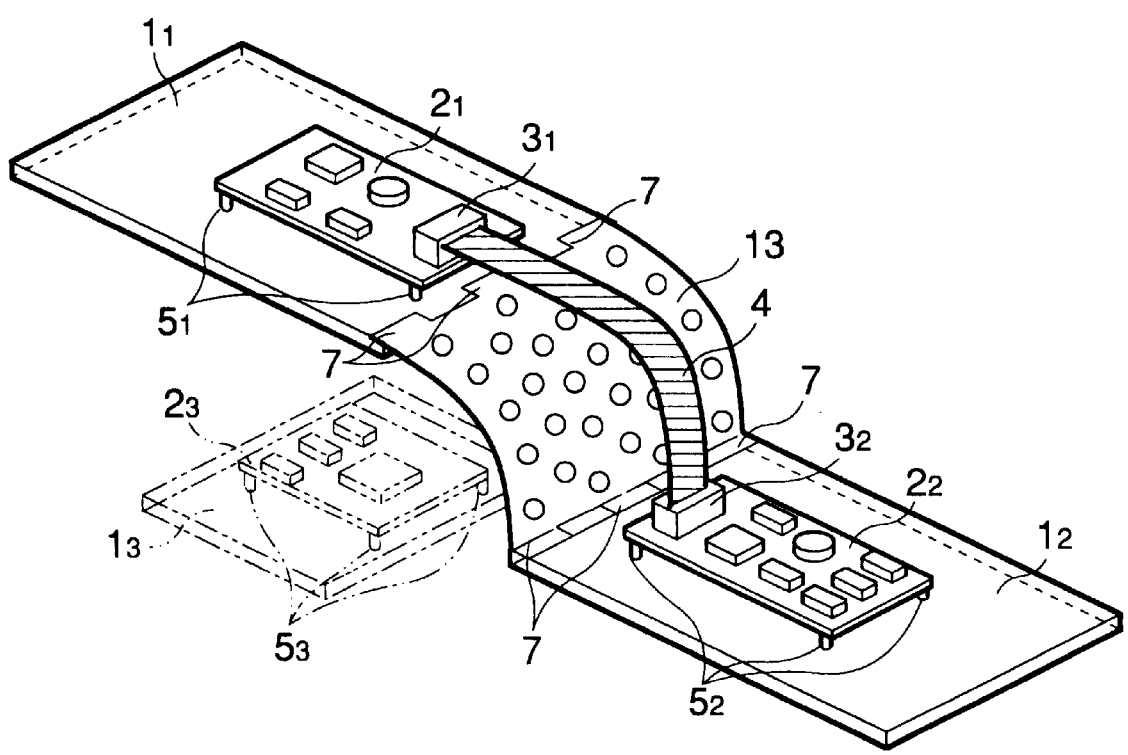
FIG. 8 is a perspective view showing the case wherein the frame grounds in a housing are interconnected via a flexible conductive sheet with radiation holes according to the fifth embodiment of the present invention.

In FIG. 8, the frame grounds are interconnected by a flexible conductive sheet 13 formed with a large number of radiation holes for sufficiently radiating heat from a portion below the conductive sheet at portions in the vicinity of the cable 4. A circuit board $2_3$ as a heat source is located below the conductive sheet 13, and a plate metal $1_3$ is connected as a frame ground FG to the board ground of the circuit board $2_3$ via members $5_3$.

In the above-mentioned embodiments, the frame grounds and conductive member or members are connected by welding, screws, conductive adhesive, solder, or the like.

The conductive member or members that interconnect the frame grounds may be disposed not only nearly immediately below the cable 4 but also nearly immediately above it. At this time, it is very effective to dispose the conductive member to extend along the cable 4 for the purpose of suppressing production of radiation noise.

In the second to fifth embodiments as well, the connected state between the frame grounds FG1 and FG2 is illustrated as in FIG. 2 of the first embodiment.

As described above, according to the present invention, since portions in the vicinity of the connected portions between the circuit boards and frame grounds are interconnected by a conductive member or members, the potential difference between the different frame grounds to which the circuit boards are connected, i.e., the common mode potential, can be reduced to decrease the common mode current that flows through the cable for interconnecting the circuit boards, thereby suppressing radiation of common mode noise from the cable. Also, even when the frame grounds are hard to interconnect by a metal plate in connection with the board layout or the position of another member inside the housing, they can be interconnected using a flexible conductive member or band-like or linear conductive member. Hence, a method of interconnecting the frame grounds in a housing, that can take a measure against radiation of common mode noise from the cable can be provided.

What is claimed is:

1. An electronic equipment having an interconnection structure between frame grounds in a housing, comprising:

a plurality of circuit boards in the housing of said electronic equipment;

a plurality of plate metals in the housing of said electronic equipment, each said plate metals being connected to one of said circuit boards as frame grounds;

a cable for interconnecting said plurality of circuit boards; and a conductive member for interconnecting said plurality of plate metals, said conductive member suppressing production of radiation noise from said cable by reducing a common mode electrical current flowing in said cable.

2. An equipment according to claim 1, wherein portions interconnected by said conductive member are neighboring positions between said frame grounds.

3. An equipment according to claim 1, wherein portions interconnected by said conductive member are frame ground portions in the vicinity of connected portions between said frame grounds and said circuit boards.

4. An equipment according to claim 1, wherein portions interconnected by said conductive member are frame ground portions in the vicinity of connected portions between said circuit boards and said frame grounds, which are connected at positions near connectors on said circuit boards.

5. An equipment according to claim 1, wherein said conductive member for interconnecting said frame grounds is disposed substantially immediately above or below said cable.

6. An equipment according to claim 5, wherein said conductive member for interconnecting said frame grounds is disposed to extend along said cable.

7. An equipment according to claim 1, wherein said conductive member for interconnecting said frame grounds has one of a sheet-like shape, mesh-like sheet shape, and band-like shape.

8. An equipment according to claim 7, wherein said sheet-like, mesh-like sheet-shaped, or band-like conductive member for interconnecting said frame grounds comprises a flexible member.

9. An equipment according to claim 8, wherein said sheet-like or band-like conductive member for interconnecting said frame grounds is locally formed with holes to radiate heat from its underside.

10. An equipment according to claim 1, wherein said conductive member for interconnecting said frame grounds has a linear shape.

11. An equipment according to claim 1, wherein said conductive member for interconnecting said frame grounds consists of one of a conductive member, conductive metal foil, conductive resin, conductive metal braided wire, conductive fiber, and the like.

12. An equipment according to claim 11, wherein connection means between said frame grounds and said conductive member is realized by connecting said conductive member using one of welding, screw, conductive adhesive, solder, and the like.

13. A method of interconnecting frame grounds in a housing, comprising the steps of:

connecting a plurality of circuit boards in the housing of an electronic equipment to individual plate metals as frame grounds;

interconnecting said plurality of circuit boards through a cable; and connecting the individual plate metals through a conductive member to suppress production of radiation noise from the cable by reducing a common mode electrical current flowing in the cable.

14. A method according to claim 13, wherein the conductive member for interconnecting the frame grounds is disposed to extend along the cable.

* * * * *

UNITED STATES PATENT AND TRADEMARK OFFICE
CERTIFICATE OF CORRECTION

PATENT NO. : 6,172,881 B1
DATED : January 9, 2001
INVENTOR(S) : Koji Hirai

Figure 9:
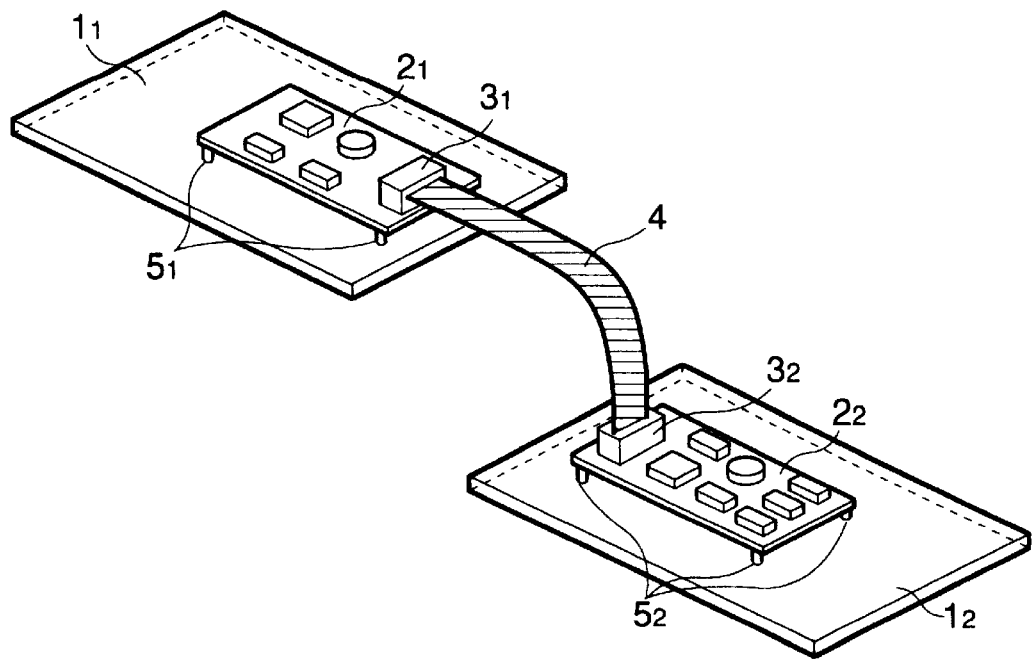
FIG. 9 is a perspective view showing conventional interconnection between the frame grounds in a housing.

It is certified that error appears in the above-identified patent and that said Letters Patent is hereby corrected as shown below:

Sheet 6,
Please replace Fig. 9 with the following:

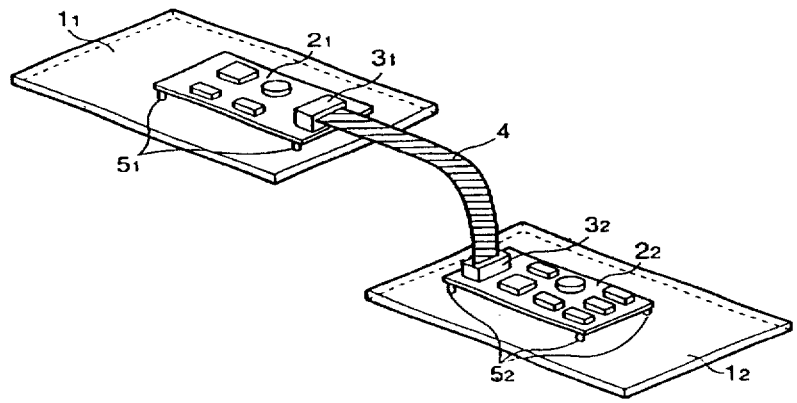

FIG.9
PRIOR ART

UNITED STATES PATENT AND TRADEMARK OFFICE
CERTIFICATE OF CORRECTION

Figure 10:
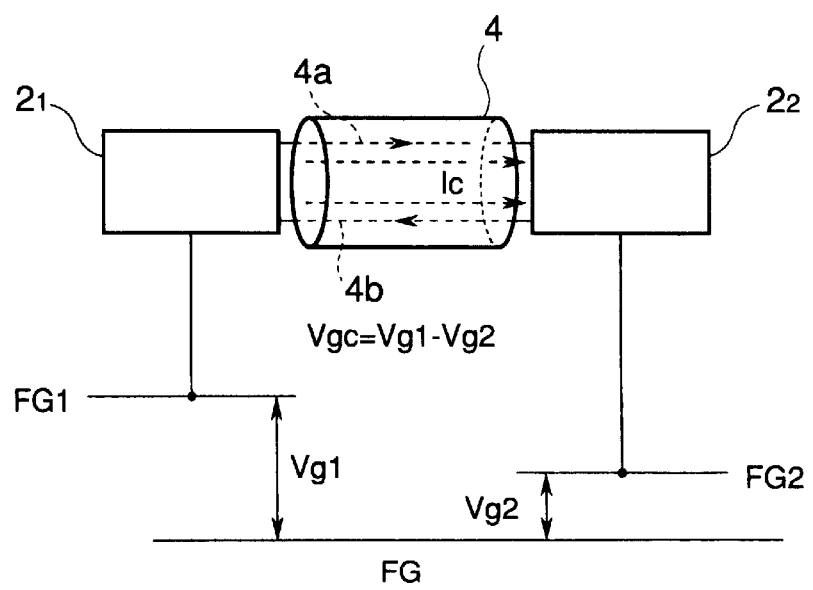
FIG. 10 is a diagram showing the structure that radiates common noise from a cable so as to explain the state between the frame grounds in the housing shown in FIG. 9.

PATENT NO.    : 6,172,881 B1
DATED         : January 9, 2001
INVENTOR(S)   : Koji Hirai It is certified that error appears in the above-identified patent and that said Letters Patent is hereby corrected as shown below:

Sheet 6,
Please replace Fig. 10 with the following:

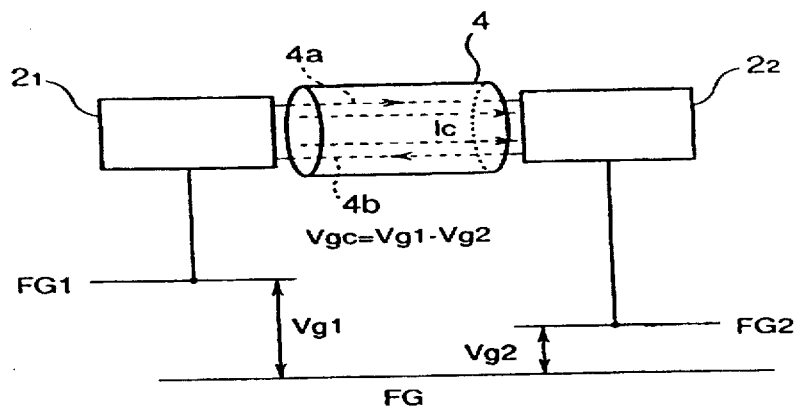

Column 2,
Line 45, "FG" should read -- (FG) --.

Signed and Sealed this

Thirteenth Day of November, 2001

Attest:

NICHOLAS P. GODICI
Acting Director of the United States Patent and Trademark Office

*Attesting Officer*